United States Patent
Fischer et al.

(10) Patent No.: US 10,962,608 B1
(45) Date of Patent: Mar. 30, 2021

(54) HIGH-IMPEDANCE FAULT DETECTION USING WIRELESS CURRENT TRANSFORMERS

(71) Applicant: Schweitzer Engineering Laboratories, Inc., Pullman, WA (US)

(72) Inventors: Normann Fischer, Colfax, WA (US); Raymond W. Rice, Pullman, WA (US); Ravindra P. Mulpuri, Pullman, WA (US); James Mobley, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 30 days.

(21) Appl. No.: 16/688,168

(22) Filed: Nov. 19, 2019

Related U.S. Application Data

(60) Provisional application No. 62/913,980, filed on Oct. 11, 2019.

(51) Int. Cl.
  *G01R 31/50* (2020.01)
  *G01R 31/62* (2020.01)
  *G01R 31/3185* (2006.01)

(52) U.S. Cl.
  CPC ..... *G01R 31/62* (2020.01); *G01R 31/318502* (2013.01); *G01R 31/50* (2020.01)

(58) Field of Classification Search
  None
  See application file for complete search history.

(56) References Cited

U.S. PATENT DOCUMENTS

| | | |
|---|---|---|
| 4,689,752 A | 8/1987 | Fernandes |
| 4,709,339 A | 11/1987 | Fernandes |
| 4,794,328 A | 12/1988 | Fernandes |
| 4,829,298 A | 5/1989 | Fernandes |
| 5,550,476 A | 8/1996 | Lau |
| 5,565,783 A | 10/1996 | Lau |
| 5,656,931 A | 8/1997 | Lau |
| 6,002,260 A | 12/1999 | Lau |
| 6,014,301 A | 1/2000 | Schweitzer |
| 6,016,105 A | 1/2000 | Schweitzer |
| 6,133,723 A | 10/2000 | Feight |
| 6,133,724 A | 10/2000 | Schweitzer |
| 6,949,921 B1 | 9/2005 | Feight |

(Continued)

OTHER PUBLICATIONS

PCT/US2020/052785 Patent Cooperation Treaty, International Search Report and Written Opinion of the International Searching Authority, dated Dec. 7, 2020.

*Primary Examiner* — Jermele M Hollington
(74) *Attorney, Agent, or Firm* — Jared L. Cherry

(57) ABSTRACT

The present disclosure pertains to systems and methods for monitoring and protecting an electric power system. In one embodiment, a system may comprise line-mounted wireless current transformers to measure at least one parameter of an alternating current (AC), receive a synchronization signal at which to measure the AC, and send a message comprising the measured AC. The system may also comprise an intelligent electronic device (IED) to send the synchronization signal to and receive the messages from the line-mount wireless current transformers, determine whether a high-impedance fault (HiZ) exists between the line-mounted wireless current transformers, and implement a control action based on the existence of the HiZ fault.

20 Claims, 4 Drawing Sheets

(56) References Cited

U.S. PATENT DOCUMENTS

| | | |
|---|---|---|
| 6,963,197 B1 | 11/2005 | Feight |
| 7,053,601 B1 | 5/2006 | Fenske |
| 7,720,619 B2 | 5/2010 | Hou |
| 7,945,400 B2 | 5/2011 | Hou |
| 8,665,102 B2 | 3/2014 | Salewske |
| 9,160,158 B2 | 10/2015 | Schweitzer |
| 10,649,020 B2* | 5/2020 | Achanta .................. H02H 3/52 |
| 10,859,639 B2* | 12/2020 | Kasztenny ......... G01R 19/2513 |
| 2009/0309754 A1* | 12/2009 | Bou ...................... G01R 15/18 340/870.02 |
| 2014/0100702 A1 | 4/2014 | Schweitzer, III et al. |
| 2014/0104738 A1 | 4/2014 | Schweitzer, III et al. |
| 2015/0005970 A1 | 1/2015 | Zweigle et al. |
| 2017/0328945 A1 | 11/2017 | Achanta |
| 2018/0106851 A1* | 4/2018 | Schweitzer, III .... G01R 31/086 |
| 2018/0287658 A1 | 10/2018 | Cosic et al. |
| 2019/0041920 A1* | 2/2019 | Spanier .................. H02J 50/40 |
| 2020/0112161 A1* | 4/2020 | Kasztenny ............. G01R 31/52 |

\* cited by examiner

HIGH-IMPEDANCE FAULT DETECTION USING WIRELESS CURRENT TRANSFORMERS

RELATED APPLICATION

This application claims priority under 35 U.S.C. § 119 to U.S. Provisional Patent Application No. 62/913,980 filed on 11 Oct. 2019, titled "High-Impedance Fault Detection Using Wireless Current Transformers" and naming James Mobley, Ravindra Mulpuri, Raymond W. Rice, and Normann Fischer as inventors, which application is hereby incorporated by reference in its entirety.

TECHNICAL FIELD

This disclosure relates to systems and methods for monitoring current flow through a portion of an electric power system and utilizing the information from such monitoring to determine conditions related to the electric power system. More particularly, but not exclusively, systems and methods consistent with the present disclosure may be used to detect and locate high-impedance ("Hiz") faults in an electric power system.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1A:
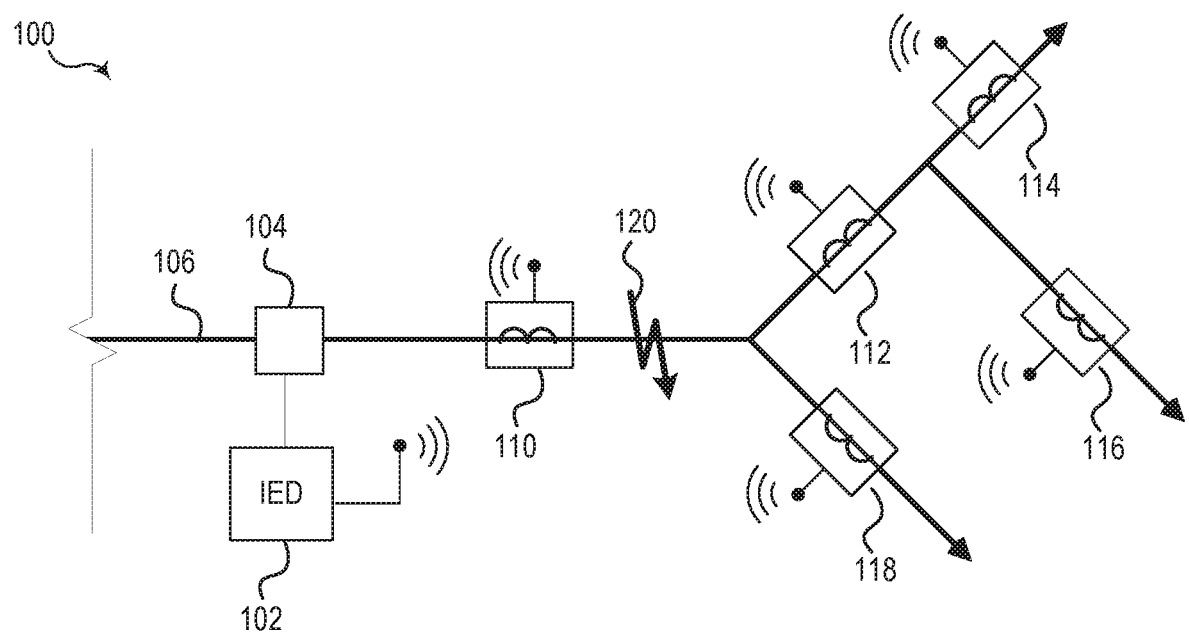
FIG. 1A illustrates a simplified one-line diagram of an electric power system with an HiZ fault including a plurality of branches monitored by a plurality of wireless current transformers for detecting high-impedance faults consistent with embodiments of the present disclosure.

High-impedance (HiZ) fault detection is a challenging task in power system protection. These faults occur when an energized conductor touches a high-impedance object, such as a tree, or falls on a surface with poor conductivity, such as asphalt, concrete or sand.

Difficulties in detecting high-impedance faults are attributable to multiple features of HiZ faults. These features include low fault current, random behavior, asymmetry of current waveform, a nonlinear relation between voltage and current of the arc, etc. These features may make it difficult to detect an HiZ fault. For example, the fault current of an HiZ fault may be below a threshold value of conventional protective devices like overcurrent relays, fuses, etc. As such, these protective devices may fail to interrupt the flow of current to the HiZ fault. Unmitigated HiZ faults may remain undetected and may create hazardous conditions. Such conditions include the potential for the energized conductor to contact a person or property or spark a fire due to electrical arcing.

The inventors of the present disclosure have recognized that wireless current transformers may provide an effective and economical approach to detecting HiZ faults. In various embodiments, line-mounted current transformers may measure the flow of current through an electric power system. The measurements may be synchronized and transmitted to an intelligent electronic device (IED) for analysis. The IED may analyze the flow of electrical current to identify and locate an HiZ fault. Such a system may provide numerous advantages, which may include, but are not limited to reducing hazardous conditions associated with unmitigated HiZ faults, reducing the potential for injury to person or property, reducing the possibility of sparking a fire, minimizing disruptions to consumers of electrical power provided by the electric power system, and minimizing the time necessary to locate and repair a fault.

According to various embodiments consistent with the present disclosure, line-powered current transformers may measure line currents at synchronized times and transmit the measurements wirelessly to an IED. In the absence of a fault, the current into a node should equal the current out of the node. Where measurement shows a loss of electrical energy without a known load, an HiZ fault may have occurred. The locations of the wireless current transformers that detect the loss of electrical power may provide information about the location of the HiZ fault.

The measurements in HiZ fault systems consistent with the present disclosure may be synchronized to ensure that any deviations are due to HiZ faults and not to current fluctuations over time. A variety of techniques to synchronize the measurements are disclosed in connection with various embodiments.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases or variations thereof, as recited throughout this specification, are not necessarily all referring to the same embodiment.

Several aspects of the embodiments described are illustrated as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or other electronic device may include a processing device such as a microprocessor, microcontroller, logic circuitry, or the like. The processing device may further include one or more special-purpose processing devices such as an application-specific interface circuit (ASIC), programmable array logic (PAL), programmable logic array (PLA), programmable logic device (PLD), field-programmable gate array (FPGA), or any other customizable or programmable device.

Electrical power generation and delivery systems are designed to generate, transmit, and distribute electrical energy to loads. Electrical power generation and delivery systems may include a variety of equipment, such as electrical generators, electrical motors, power transformers, power transmission and distribution lines, circuit breakers, switches, buses, transmission and/or feeder lines, voltage regulators, capacitor banks, and the like. Such equipment may be monitored, controlled, automated, and/or protected using IEDs that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, real-time automation controllers, bay controllers, meters, recloser controls, communication processors, computing platforms, programmable logic controllers (PLCs), programmable automation controllers, input and output modules, governors, exciters, statcom controllers, static var compensators, on-load tap-changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

Electric power system equipment may be monitored and protected from various malfunctions and/or conditions using one or more IEDs. For example, an IED may be configured to detect abnormal and protect the electric power system equipment from abnormal conditions, such as faults. IEDs may be configured to take protective actions such as commanding a circuit breaker to open, in the event of a detected fault. IEDs may further be configured to determine a distance and/or direction to a fault based on operating conditions detected during the fault event.

In several embodiments herein, IEDs may be coordinated in the monitoring and protection functions applied to electric power systems. For example, the IEDs may be coordinated to remove electric power from the smallest practical portion of the electric power system while removing the fault from the electric power system. IEDs may be coordinated to maintain voltage and/or frequency within acceptable levels on the electric power system by operating voltage regulators, capacitor banks, reactors, and the like at various locations on the electric power system. Furthermore, IEDs may be coordinated to determine event locations on the electric power system.

FIG. 1A illustrates a simplified one-line diagram of an electric power system 100 including a plurality of branches monitored by a plurality of wireless current transformers for detecting HiZ faults consistent with embodiments of the present disclosure. An IED 102 may monitor certain measured parameters, including, among other things, a current flow through conductor 106 and other conductors in electrical communication with conductor 106. IED 102 may be communicatively coupled with breaker 104 and may actuate breaker 104 in response to the occurrence of an HiZ fault or other type of fault.

IED 102 may further be in communication with a plurality of wireless current transformers 110-118. Wireless current transformers 110-118 may be configured to measure a current flowing through a conductor on which each wireless current transformer is mounted. Each wireless current transformer 110-118 may draw electrical energy from the conductor on which it is mounted to power its operation. Each wireless current transformer 110-118 may transmit measurements of electrical current flowing through an associated electrical conductor to IED 102. The ability of wireless current transformers 110-118 to draw power from electric power system 100 and the ability to transmit measurements wirelessly may facilitate installation of an HiZ fault detection system consistent with the present disclosure in existing electric power system 100.

When synchronized measurements (i.e., magnitude and phase of currents are measured at the same time) are made in the absence of a fault, the current measured by wireless current transformer 110 should equal the sum of the currents measured by wireless current transformers 112 and 118, as shown by Eq. 1.

$$i_{WCT110} = i_{WCT112} + i_{WCT118} \qquad \text{Eq. 1}$$

Eq. 1 will not be true for the scenario illustrated in FIG. 1A due to the current flowing through HiZ fault 120. IED 102 may detect HiZ fault 120 by comparing the sum of the currents measured by wireless current transformers 112 and 118 to the current measured by wireless current transformer 110. Upon determining that the measured currents are not equal, IED 102 may determine that a fault exists downstream from wireless current transformer 110 and upstream from wireless current transformers 112 and 118. Based on such a determination, IED 102 may actuate breaker 104 to interrupt the flow of electrical current to HiZ fault 120.

The location of each wireless current transformer 110-118 in system 100 may be determined upon installation and used to identify a location of the HiZ fault 120. The resolution of the location may depend on the number of wireless current transformers utilized, with a higher location resolution corresponding to a greater number of wireless current transformers. In various embodiments, each wireless current transformer may be associated with a unique identifier. IED 102 may utilize the identifiers both in performing an analysis of the currents flowing in system 100 and in identifying the location of an HiZ fault 120.

Figure 1B:
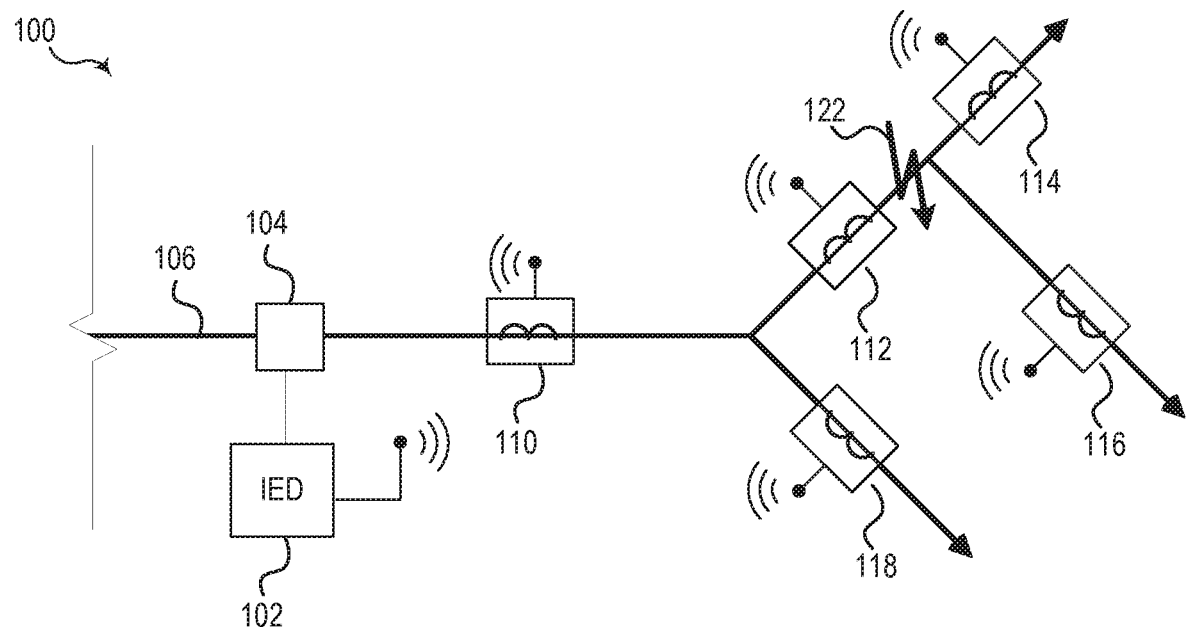
FIG. 1B illustrates the electric power system of FIG. 1A in which an HiZ fault is disposed at a different location consistent with embodiments of the present disclosure

FIG. 1B illustrates the electric power system 100 of FIG. 1A in which an HiZ fault 122 is disposed downstream from wireless current transformer 112 and upstream from wireless current transformers 114 and 116 consistent with embodiments of the present disclosure. Unlike the scenario illustrated in FIG. 1A, synchronized measurements of current in system 100 in the scenario illustrated in FIG. 1B will satisfy Eq. 1.

The current measurements made by wireless current transformers 112, 114, and 116 may be used to detect HiZ fault 122. More specifically, when synchronized measurements are made in the absence of a fault, the current measured by wireless current transformer 112 should equal the sum of the currents measured by wireless current transformers 114 and 116, as shown by Eq. 2.

$$i_{WCT112} = i_{WCT114} + i_{WCT116} \qquad \text{Eq. 2}$$

The presence of HiZ fault 122 downstream from wireless current transformer 112 and upstream from wireless current transformers 114 and 116 will not satisfy cause Eq. 2 for the scenario illustrated in FIG. 1B because current is flowing through HiZ fault 122. IED 102 may detect HiZ fault 122 by comparing the sum of the currents measured by wireless current transformers 114 and 116 to the current measured by wireless current transformer 112. Upon a determination that the currents are not equal, IED 102 may determine that a fault exists between wireless current transformer 112 and wireless current transformers 114 and 116. Based on such a determination, IED 102 may actuate breaker 104 to interrupt the flow of electrical current to HiZ fault 122.

As may also be appreciated, in the event of multiple faults (e.g., the simultaneous occurrence of faults 120 and 122), Eqs. 1 and 2 may both be false. In such a scenario, IED 102 may determine that multiple faults have occurred. Further, to improve the robustness of the detection, the process can be repeated, or other criteria may be evaluated before a protective action is implemented.

Figure 2:
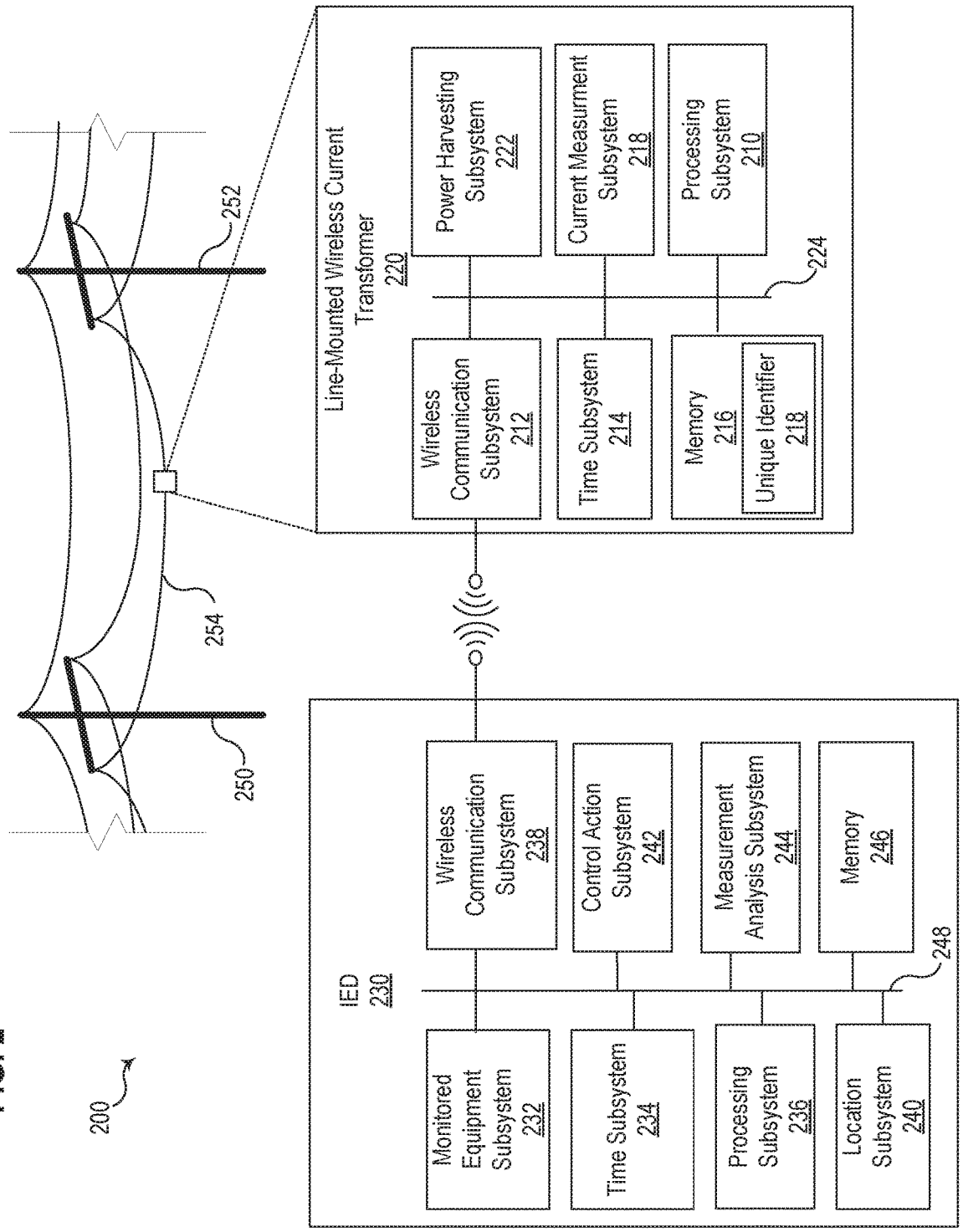
FIG. 2 illustrates a simplified representation of a system comprising a line-mounted wireless current transformer mounted to an electrical conductor and an intelligent electronic device consistent with embodiments of the present disclosure.

FIG. 2 illustrates a simplified representation of a system 200 comprising a line-mounted wireless current transformer 220 mounted to an electrical conductor 254, and an IED 230 consistent with embodiments of the present disclosure. Line-mounted wireless current transformer 220 is mounted to conductor 254, which is suspended between pylons 250, 252. Only a single line-mounted wireless current transformer is illustrated. In other embodiments, multiple line-mounted wireless current transformers may be used, or IED 230 may assume that the current on other phases are the same magnitude as the first current but shifted in phase (i.e., shifted by 120 degrees in a three phase system).

Line-mounted wireless current transformer 220 and IED 230 each contain various subsystems represented by functional blocks. The functional blocks in line-mounted wireless current transformer 220 may communicate using data bus 224, and the functional blocks in IED 230 may communicate using data bus 248.

A wireless communication subsystem 212 may be configured to wirelessly communicate information, such as a current measurement from line-mounted wireless current transformer 220, to IED 230. Wireless communication subsystem 212 may utilize various technologies to enable wireless communication. Such communication may include radio frequency communications and may employ analog or digital modulation techniques and protocols. Wireless communication subsystem 212 may enable transmission of data from line-mounted wireless current transformer 220 related to electrical parameters associated with conductor 254. Such electrical parameters may comprise current measurements, phase measurements, and the like. In some embodiments, wireless communication subsystem 212 may enable bi-directional communication between line-mounted wireless current transformer 220 and IED 230, while in other embodiments, communication may be unidirectional.

A time subsystem 214 may track the passage of time and provide a consistent time reference with respect to which measurements may be made. In various embodiments, line-mounted wireless current transformer 220 may receive a synchronization signal from IED 230. Further, time subsystem 214 may use the received time signal to associate various measurements with time stamps according to the time signal received from IED 230. In other embodiments, time subsystem 214 may comprise an oscillator or other device capable of tracking the passage of time.

A power harvesting subsystem 222 may be capable of harvesting power from conductor 254. In some embodiments, power harvesting subsystem 222 may utilize a current transformer to harvest energy from conductor 254. In various embodiments, the current transformer used to harvest power from conductor 254 may also provide a signal that is analyzed and used to obtain electrical parameter measurements from conductor 254. Power harvesting subsystem 222 may further incorporate a power storage device that may be used to transmit information when current is not flowing through conductor 254 and power cannot be harvested. A power storage device may be embodied as a battery, a supercapacitor, and the like. Line-powered wireless power transformer 220 may reduce the need for ongoing maintenance associated with devices powered with batteries.

A current measurement subsystem 218 may be configured to monitor electrical parameters associated with conductor 254. Current measurement subsystem 218 may sample a current flowing through conductor 254 over one or more alternating current (AC) cycles to determine the frequency and phase of the signal. Such measurements may be transmitted by the wireless transmission subsystem 212 to IED 230.

The memory 216 may include computer system readable media in the form of volatile memory, such as random access memory (RAM) and/or cache memory. The memory 216 may further include other removable/non-removable, volatile/non-volatile computer system storage media. In various embodiments, the memory 216 may include at least one program product having a set of program modules that are configured to carry out the functions of detecting HiZ faults in an electric power system. Moreover, the memory 216 may store time signals, including the synchronization signal, received from IED 230 and current measurements obtained by the current measurement subsystem 218.

In various embodiments, memory 216 may comprise a unique identifier 218. Unique identifier 218 may be included in messages transmitted by line-mounted wireless current transformer 220 and may be used by IED 230 to differentiate the sources of messages received from a plurality of line-mounted wireless current transformers. The unique identifier 218 may be associated with a particular location stored by location subsystem 240, and accordingly, system 200 may provide an indication of a location of an HiZ fault based on the specific line-mounted wireless current transformers surrounding the HiZ fault.

A processing subsystem 210 may be configured to process information received from the current measurement subsystem 218, the wireless communication subsystem 212, and the memory 216. Processing subsystem 210 may operate using any number of processing rates and architectures. Processing subsystem 210 may be configured to perform various algorithms and calculations described herein. Processing subsystem 210 may be embodied as a general-purpose integrated circuit, an application-specific integrated circuit, a field-programmable gate array, and/or any other suitable programmable logic device.

Turning now to the functional blocks associated with IED 230, a monitored equipment subsystem 232 may be in communication with monitored equipment that is operable to control an aspect or a portion of an electric power system. The monitored equipment subsystem 232 may be configured to issue commands to and/or receive status information from monitored equipment. In certain embodiments, monitored equipment subsystem 232 may be in communication with, for example, a circuit breaker and may issue commands to the circuit breaker to selectively connect or disconnect portions of the electric power system.

Time subsystem 234 may track the passage of time and provide a consistent time reference with respect to which measurements may be made or which communications are received. In some embodiments, time subsystem 234 may transmit a synchronization signal to line-mounted wireless current transformer 220 that is used to time stamp or time align measurements made by the current measurement subsystem 218. Time subsystem 234 may receive a time signal from another source (e.g., a GNSS clock signal) or may comprise an oscillator or other device capable of tracking the passage of time.

Memory 246 may include computer system readable media in the form of volatile memory, such as random access memory (RAM) and/or cache memory. The memory 246 may further include other removable/non-removable, volatile/non-volatile computer system storage media. In various embodiments, the memory 246 may include at least one program product having a set of program modules that are configured to synchronize current measurements made by line-mounted wireless current transformers (e.g., line-mounted wireless current transformer 220). In various embodiments, the memory 246 may include a schedule. In some cases, the schedule may provide determine times at which the line-mounted wireless current transformers measure the current in an electric power system. In other embodiments, the IED may specify a measurement time at which each of the plurality of wireless current transformers is to make a measurement.

Processing subsystem 236 may process information received from voltage monitoring subsystem 244, wireless communication subsystem 238, and memory 246. Processing subsystem 236 may operate using any number of processing rates and architectures. Processing subsystem 236 may be configured to perform various algorithms and calculations described herein. In various embodiments, processing subsystem 236 may be embodied as a general-purpose integrated circuit, an application-specific integrated circuit, a field-programmable gate array, and/or any other suitable programmable logic device.

A location subsystem 240 may associate line-mounted wireless current transformer 220 with a location. Although not illustrated, system 200 may comprise a plurality of line-mounted wireless current transformers, each of which may be associated with a location. When an HiZ fault is detected, location subsystem 240 may analyze the plurality of measurements to determine a location of the HiZ fault.

Wireless communication subsystem 238 may receive information from and/or send information to line-mounted wireless current transformer 220. Wireless communication subsystem 238 may be compatible with the wireless communication subsystem 212, utilizing the same communication technology and communication protocol(s). In various embodiments, IED 230 may also comprise other communication interfaces (e.g., a wired communication interface) to communicate with other devices, such as other IEDs, a SCADA system, etc.

A control action subsystem 242 may implement control actions based on information received from line-mounted wireless current transformer 220 and other electrical parameters associated with an AC signal on conductor 254. In some embodiments, control action subsystem 242 may control a circuit breaker, which may be selectively activated and deactivated based on electrical conditions. Control action subsystem 242 may issue commands to selectively connect and disconnect portions of an electric power system using monitored equipment subsystem 232.

Current monitoring subsystem 244 may monitor various electrical parameters associated with electrical power flowing through conductor 254. In certain embodiments, current monitoring subsystem 244 may be associated with a current sensor (not shown). Information from a current sensor may be compared to a current signal received from line-mounted wireless current transformer 220 to determine a phase angle, for example.

Figure 3A:
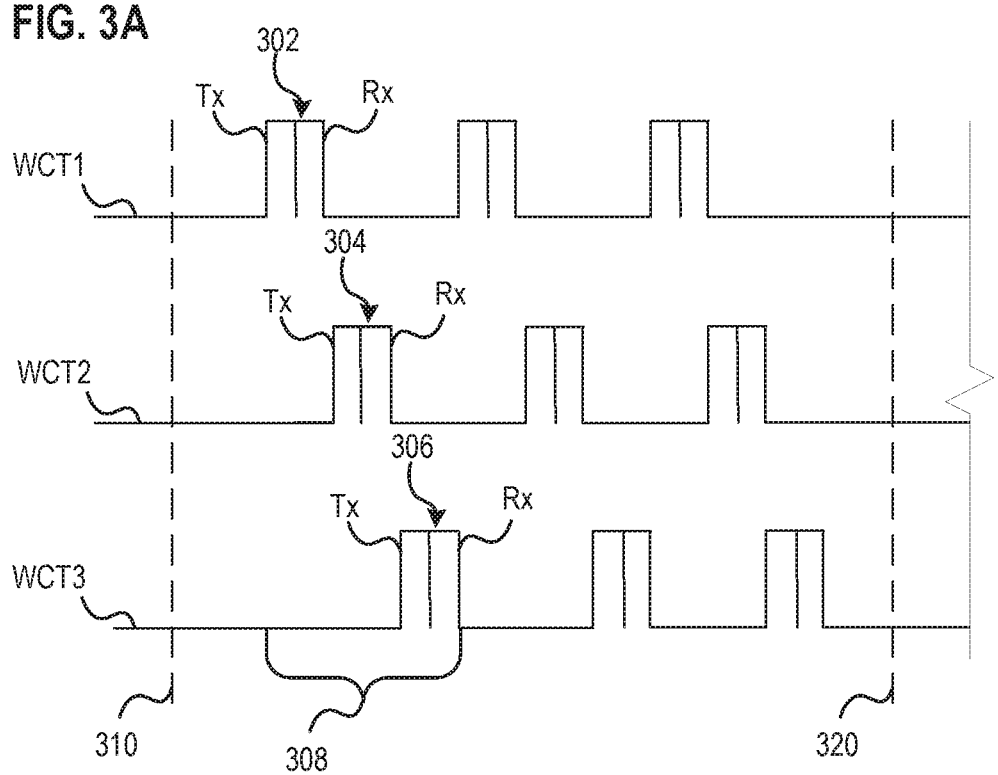
FIG. 3A illustrates a communication scheme among a plurality of wireless current transformers that transmit (Tx) information to and receive (Rx) from an intelligent electronic device ("IED") consistent with embodiments of the present disclosure.

FIG. 3A illustrates a communication scheme among a plurality of wireless current transformers that transmit information to and receive from an IED (not shown) consistent with embodiments of the present disclosure. In the illustrated embodiment, only one wireless current transformer transmits or receives information at a time. This scheme allows the IED to incorporate only a single receiver, which may reduce the cost and complexity associated with multiple receivers. Further, the illustrated time-division access scheme allows a plurality of wireless current transformers to utilize the same bandwidth and may reduce inference. Of course, in other embodiments, the IED may incorporate multiple receivers and may accommodate simultaneous transmissions from multiple wireless current transformers. In the illustrated embodiment, a receive (Rx) window immediately follows the transmit (Tx) window. During the Rx window, the wireless current transformers may receive a message from the IED (not shown). The Tx window and the Rx window may collectively be referred to as a communication window. Outside of the communication window, a wireless communication subsystem may be deactivated to reduce power consumption.

Each of a first wireless current transformer, WCT1, a second wireless current transformer, WCT2, and a third wireless current transformer, WCT3 may each measure a current through a respective conductor at a time designated by line 310. In various embodiments, the measurements may comprise a magnitude of the current, a phase of the current, or both. The measurement(s) may be stored by each wireless current transformer until the measurements are transmitted to an IED, the measurements are replaced by updated measurements, the memory in the device is full, or other condition.

The first wireless current transformer, WCT1, may utilize a first communication window 302. During the first communication window 302, WCT1 may transmit information to an IED during the Tx window. Information transmitted during the Tx window may include a current measurement, a phase measurement, or other measurement made by WCT1. WCT1 may receive information from the IED during the Rx window.

Information received during the Rx window may include synchronization information from the IED or instructions to make a measurement at a specified time. Once synchronized, each wireless current transformer may measure the current flowing through a respective feeder or branch at the same time. In various embodiments, the IED establishes measurement times according to a schedule. For example, the IED may be programmed to obtain synchronized measurements every five seconds. As such, the IED may instruct each wireless current transformation to take a measurement once every five seconds, and may provide information during the Rx window to ensure that an internal clock of each wireless current transformer is synchronized with sufficient accuracy to ensure that the measurements are obtained at the same time. In other embodiments, measurement times may be established more frequently or less frequently. In still other embodiments, measurement times may not be established according to a fixed schedule and may be set on an ad hoc basis.

The second wireless transformer, WCT2, may utilize a second communication window 304. During the second communication window 304, WCT2 may transmit information to the IED during the Tx window and may receive information from the IED during the Rx window. As illustrated, the second communication window 304 opens when the first communication window 302 closes. In various embodiments, the sequence, initiation, and duration of each communication window may be specified by the IED and communicated during the Tx window.

The third wireless transformer, WCT3, may utilize a third communication window 306. During the third communication window 306, WCT3 may transmit information to the IED during the Tx window and may receive information from the IED during the Rx window. A span of time 308 from the start of the first communication window 302 to the end of the third transmission window 306 may depend on various factors, such as the number of wireless current transformers in a particular system, the speed of the transmissions, and the quantity of data to be transmitted.

As illustrated, each of WCT1, WCT2, and WCT3 may send and receive multiple communication signals to and from the IED during multiple communication windows. Repeating transmissions during multiple communication windows may help to reduce the possibility of data loss due to noise, data errors, and other factors. Of course, not all embodiments repeat transmissions. If transmissions are repeated, the repetition may be determined by the level of noise, the power budget of the system, and other parameters. In alternative embodiments, an IED may acknowledge receipt of the measurement during the Rx window, and repeated transmissions may be avoided.

Once the IED has received the synchronized data from each of the wireless current transformers, the IED may analyze the information to determine whether an HiZ fault has occurred. The cycle may repeat with a second synchronized measurement occurring at a time designated by line 320.

Figure 3B:
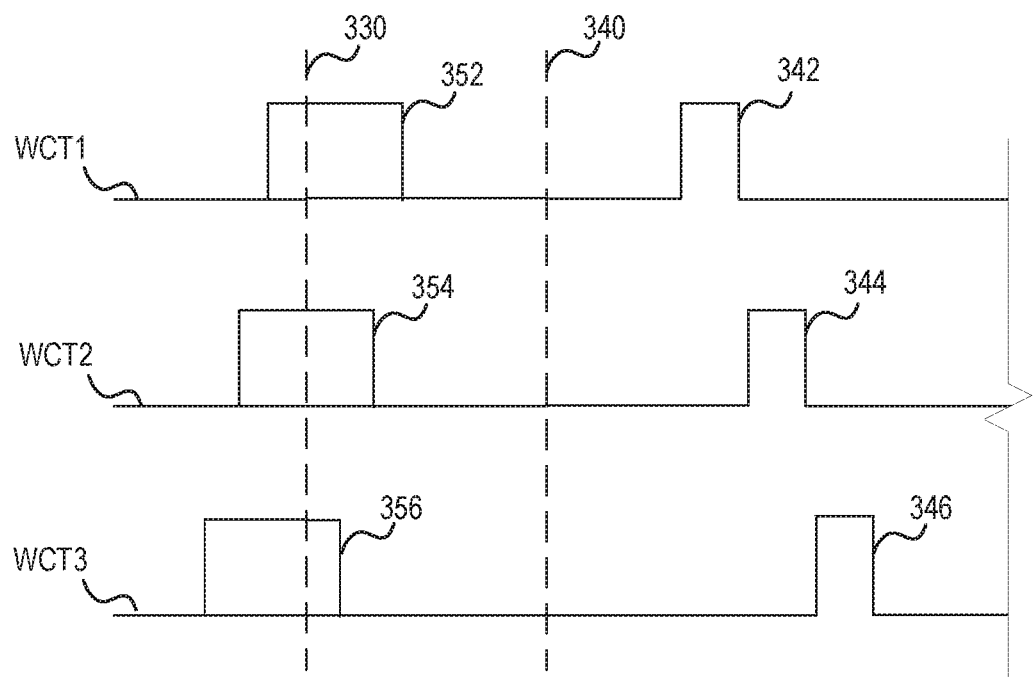
FIG. 3B illustrates an alternative communication scheme among a plurality of the wireless current transformers and an intelligent electronic device consistent with embodiments of the present disclosure.

FIG. 3B illustrates an alternative communication scheme among a plurality of the wireless current transformers and an intelligent electronic device consistent with embodiments of the present disclosure. In the illustrated embodiment, the plurality of wireless current transformers are each commanded to open an Rx window at the same time. During the Rx window, each wireless current transformer is synchronized with the IED.

Each wireless current transformer WCT1, WCT2, and WCT3 may open an Rx window 352, 354, and 356, respectively. An opening time for each Rx window 352, 354, and 356 may be specified by an IED and tracked using a time source associated with each wireless current transformer WCT1, WCT2, and WCT3. The individual time sources may drift with respect to one another, and as such, the windows may not open at precisely the same time. To account for such drift, the IED may make a synchronization transmission 330 in approximately the middle of the Rx window. The length of the Rx window may be selected to ensure that each device is ready to receive the synchronization transmission 330 based on the expected drift.

During each Rx window 352, 354, and 356 an IED may both provide synchronization signals (i.e., may provide information that each wireless current transformer WCT1, WCT2, and WCT3 may use to synchronize an internal time source) and specify a measurement time for each wireless current transformer WCT1, WCT2, and WCT3 to perform a measurement. In the illustrated embodiment, the measurement time is designated by line 340. At the measurement time, each wireless current transformer WCT1, WCT2, and WCT3 may measure electrical conditions on an associated conductor.

Following the measurement, a series of Tx windows open to enable the wireless current transformers WCT1, WCT2, and WCT3 to transmit the measurements to the IED. The first wireless current transformer, WCT1, may utilize a first Tx window 342. The second wireless current transformer, WCT2, may utilize a second Tx window 344. Finally, the third wireless current transformer, WCT3, may utilize a third Tx window 346. In some embodiments, each wireless current transformer may transmit the measurements in multiple Tx windows to increase the likelihood that the IED successfully receives the transmitted data.

In one specific embodiment, the communication patterns shown in FIGS. 3A and 3B may both be utilized in a high-impedance fault detection system consistent with the present disclosure. In such an embodiment, an IED may transmit a command to each of the plurality of wireless current transformers during a respective communication window (i.e., communication windows 302, 304, and 306) to open Rx windows 352, 354, and 356). In such embodiments, the synchronization signal may be sent to all wireless current transformers in the system at the same time.

Figure 4:
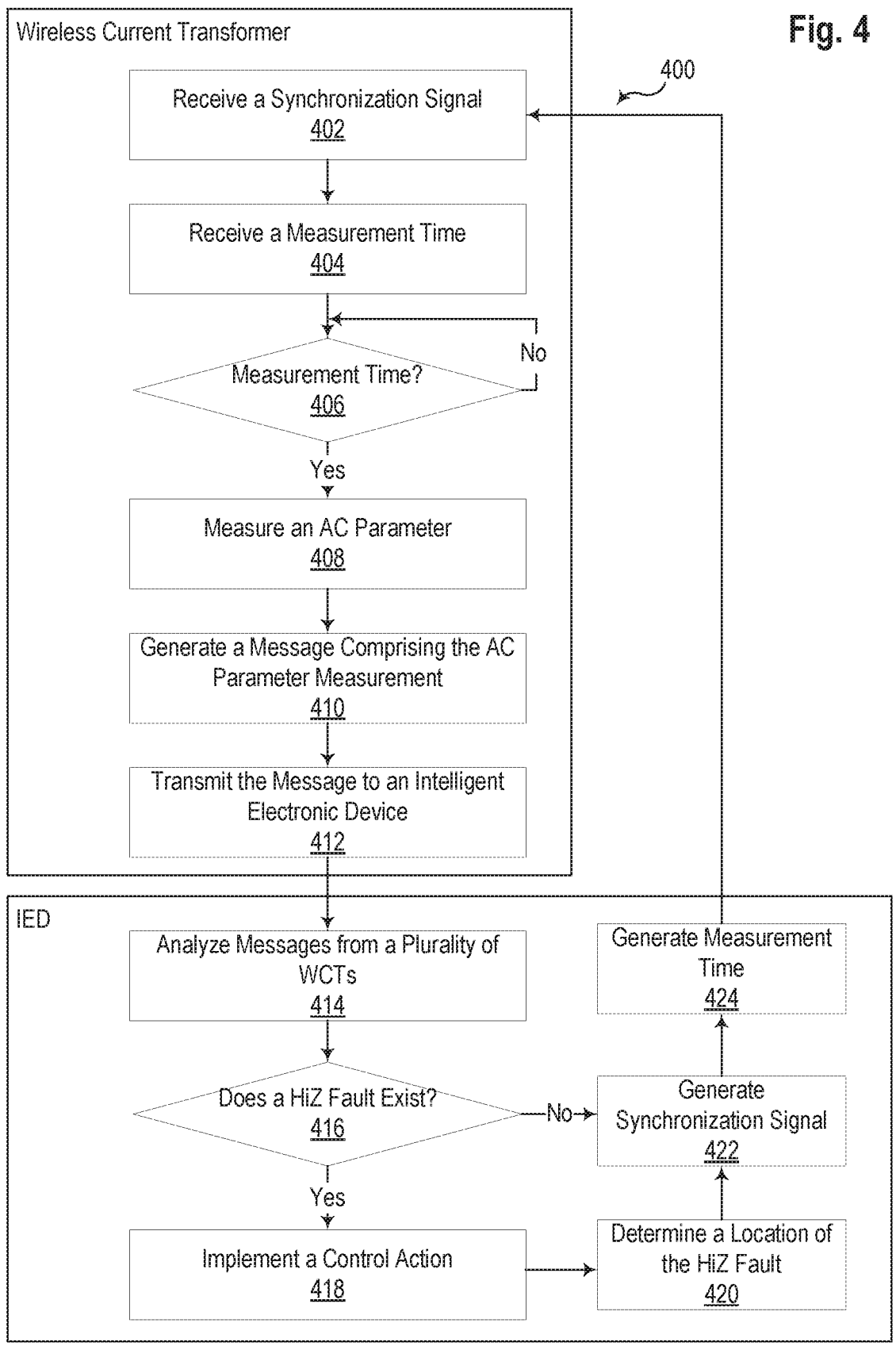
FIG. 4 illustrates a flow chart of a method for monitoring and protecting an electric power system consistent with embodiments of the present disclosure.

FIG. 4 illustrates a flow chart of a method 400 for detecting HiZ faults in an electric power system consistent with embodiments of the present disclosure. At 402, each of a plurality of line-mounted wireless current transformers may receive a synchronization signal. The synchronization signal may allow the wireless current transformer to synchronize an internal time source with an external time source. The synchronization may allow the plurality of wireless current transformers to conduct measurements at the same time.

At 404, each of the plurality of wireless current transformers may receive a measurement time. The measurement time is a time at which to measure at least one parameter of an alternating current (AC) flow through an electrical conductor of the electric power system. In various embodiments, the synchronization signal and measurement time may be transmitted to each wireless current transformer during a unique communication window, as illustrated in FIG. 3A. In other embodiments, the synchronization signal and the measurement time may be transmitted to multiple wireless current transformers during one communication window, as illustrated in FIG. 3B.

At 406, each of the line-mounted wireless current transformers may determine whether a measurement should be made based on the measurement time. At the measurement time, at least one AC parameter may be measured at 408. In one embodiment, the AC parameter may comprise the magnitude of the current. In another embodiment, the AC parameter may comprise the phase of the current. In still other embodiments, both the magnitude and phase may be measured along with other parameters.

At 410 a message may be generated comprising the AC parameter measurement. In various embodiments, the message may also comprise an identifier associated with the wireless current transformer that generated the message. Such an identifier may comprise, for example, a serial number or other unique identifier.

At 412, the message may be transmitted to an IED. In various embodiments, a plurality of wireless current transformers may take turns transmitting messages, as illustrated in FIGS. 3A and 3B. In such embodiments, a single receiver may be used to communicate with the plurality of wireless current transformers, thus avoiding the cost and complexity of including multiple receivers.

At 414, the IED may analyze messages from a plurality of wireless current transformers. The messages may include, for example, measurements of the magnitude of currents at various nodes in the electric power system. Using such measurements, the IED may determine whether current flowing into a particular node is equal to current flowing out of a connected node.

The IED may determine whether an HiZ fault exists at 416 after analyzing the messages from the plurality of wireless current transformers. If an HiZ fault exists, a control action may be implemented at 418. The control action may interrupt the flow of electricity to the HiZ fault by actuating a breaker upstream of the HiZ fault. If no HiZ fault exists, the IED may generate a synchronization signal at 422.

At 420, the IED may determine a location of the HiZ fault based upon which wireless current transformers are associated with the HiZ fault. As illustrated in FIG. 2, a location subsystem may associate each wireless current transformer with a location in an electric power system. The location of the HiZ fault may be determined based on the locations of the wireless current transformers associated with the HiZ fault.

At 422, a synchronization signal may be generated, and at 424, a measurement time may be generated. The synchronization signal and the measurement time may be transmitted by the IED to the plurality of wireless current transformers.

While specific embodiments and applications of the disclosure have been illustrated and described, it is to be understood that the disclosure is not limited to the specific configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to detect a high-impedance (HiZ) fault in an electric power system, the system comprising:
   a plurality of line-mounted wireless current transformers, each of the plurality of line-mounted wireless current transformers comprising:
      a first time subsystem:
         to track a measurement time; and
         to receive a synchronization signal;
      a current measurement subsystem comprising a current transformer to measure at least one parameter of an alternating current (AC) flow through an electrical conductor of the electric power system at the measurement time;
      a first processing subsystem to generate a message comprising the at least one parameter of the AC; and
      a first wireless communication subsystem:
         to transmit the message; and
         to receive the synchronization signal; and
   an intelligent electronic device (IED), comprising:
      a second wireless communication subsystem:
         to transmit the synchronization signal to the plurality of line-mounted wireless current transformers; and
         to receive the messages from the plurality of line-mounted wireless current transformers;
      a second time subsystem:
         to generate the synchronization signal; and
         to establish the measurement time; and
      a second processing subsystem to detect the HiZ fault based on messages received from the plurality of line-mounted wireless current transformers; and
      a control action subsystem to implement a control action to interrupt the AC flow based on detection of the HiZ fault.

2. The system of claim 1, wherein of the plurality of line-mounted wireless current transformers each further comprises a power harvesting subsystem to harvest power from the current transformer to power the line-mounted wireless current transformer.

3. The system of claim 1, wherein the message generated by the first processing subsystem of each of the plurality of line-mounted wireless current transformers further comprises a unique identifier to identify a source of the message.

4. The system of claim 3, wherein the IED further comprises a location subsystem:
   to associate the unique identifier of each of the plurality of line-mounted wireless current transformers with a location; and to determine a location of the HiZ fault based on the location of the plurality of line-mounted wireless current transformers associated with the HiZ fault.

5. The system of claim 1, wherein the control action comprises opening a circuit breaker to stop a flow of current to the HiZ fault.

6. The system of claim 1, wherein the measurement time is determined according to a schedule.

7. The system of claim 6, wherein the wireless communication subsystem is selectively activated during a communication window according to the schedule.

8. The system of claim 7, wherein the communication window comprises a transmit window and a receive window.

9. The system of claim 1, wherein each of the plurality of wireless current transformers transmits the message during a unique transmit window and the second wireless communication subsystem comprises a single receiver.

10. The system of claim 1, wherein the at least one parameter of the AC comprises one of a current magnitude and a phase.

11. A method for detecting a high-impedance (HiZ) fault in an electric power system, the method comprising:
   each of a plurality of line-mounted wireless current transformers:
      receiving, using a first wireless communication subsystem, a synchronization signal;
      receiving, using the first wireless communication subsystem, a measurement time;
      tracking, using a first time system, the measurement time;
      measuring, using a current measurement subsystem, at least one parameter of an alternating current (AC) flow through an electrical conductor of the electric power system at the measurement time;
      generating, using a first processing subsystem of the plurality of line-mounted wireless current transformers, a message comprising the at least one parameter of the AC; and
      transmitting, using the first wireless communication subsystem, the message; and
   an intelligent electronic device (IED):
      transmitting, using a second wireless communication subsystem, the synchronization signal to the plurality of line-mounted wireless current transformers;
      receiving, using the second wireless communication subsystem, the messages from the plurality of line-mounted wireless current transformers;
      generating, using a second time subsystem, the synchronization signal;
      establishing, using the second time subsystem, the measurement time;
      detecting, using a second processing subsystem, the HiZ fault based on messages received from the plurality of line-mounted wireless current transformers; and
      interrupting, using a control action subsystem, AC flow based on detection of the HiZ fault.

12. The method of claim 11, further comprising powering each of the plurality of line-mounted wireless current transformers by harvesting power from the current transformer.

13. The method of claim 11, further comprising including a unique identifier in the message to identify a source of the message.

14. The method of claim 13, further comprising:
   associating the unique identifier of each of the plurality of line-mounted wireless current transformers with a location; and
   determining a location of the HiZ fault based on the location of the plurality of line-mounted wireless current transformers associated with the HiZ fault.

15. The method of claim 11, wherein the control action comprises opening a circuit breaker to stop a flow of current to the HiZ fault.

16. The method of claim 11, further comprising determining the measurement time based on a schedule.

17. The method of claim 16, further comprising selectively activating the wireless communication subsystem during a communication window according to the schedule.

18. The method of claim 17, wherein the communication window comprises a transmit window and a receive window.

19. The method of claim 11, further comprising each of the plurality of line-mounted wireless current transformers transmitting the message during a unique transmit window, with the second wireless communication subsystem comprising a single receiver.

20. The method of claim 11, wherein the one parameter of the AC comprises one of a current magnitude and a phase.

* * * * *